United States Patent
Schiavone et al.

(12) 
(10) Patent No.: US 6,171,973 B1
(45) Date of Patent: Jan. 9, 2001

(54) PROCESS FOR ETCHING THE GATE IN MOS TECHNOLOGY USING A SION-BASED HARD MASK

(75) Inventors: Patrick Schiavone, Villard-Bonnot; Frédéric Gaillard, Voiron, both of (FR)

(73) Assignee: France Telecom, Paris (FR)

( * ) Notice: Under 35 U.S.C. 154(b), the term of this patent shall be extended for 0 days.

(21) Appl. No.: 09/202,717
(22) PCT Filed: Jun. 9, 1997
(86) PCT No.: PCT/FR97/01015
   § 371 Date: Sep. 1, 1999
   § 102(e) Date: Sep. 1, 1999
(87) PCT Pub. No.: WO97/48127
   PCT Pub. Date: Dec. 18, 1997

(30) Foreign Application Priority Data

Jun. 13, 1996 (FR) .................................................. 96 07346

(51) Int. Cl.⁷ .................................................. H01L 21/00
(52) U.S. Cl. .......................... 438/719; 148/33.4; 257/288; 438/9; 438/724; 438/757; 438/744
(58) Field of Search ............... 438/8, 9, 14, 719, 438/724, 740, 744, 752, 753, 757; 216/59, 60, 67, 79, 84, 85, 99; 148/33.4, 33.5, 33.6; 257/288, 435, 437

(56) References Cited

U.S. PATENT DOCUMENTS 5,066,615 11/1991 Brady et al. .
5,378,659 1/1995 Roman et al. .
5,605,601 * 2/1997 Kawasaki .............................. 438/724 X

FOREIGN PATENT DOCUMENTS 0 588 087 3/1994 (EP) .

OTHER PUBLICATIONS

Patent Abstracts of Japan, Publication No. 062755574, dated Sep. 30, 1994.
Patent Abstracts of Japan, Publication No. 07066176, dated Mar. 10, 1995.
Patent Abstracts of Japan, Publication No. 07161689, dated Jun. 23, 1995.
Patent Abstracts of Japan, Pbulication No. 07106308, dated Apr. 21, 1995.
Patent Abstracts of Japan, Publication No. 62136022, dated Jun. 19, 1987.
Gocho et al., "CVD Method of Anti–Reflective Layer Film for Excimer Laser Lithography," Int. Conf. on Solid State Devices & Materials, Aug. 1993, pp. 570–572.
Chen et al., "A Novel and Effective PECVD $SiO_2SiN$ Antireflection Coating for Si Solar Cells," IEEE Transactions on Electron Devices, Jun. 1993, pp. 1161–1165.
International Search Report for Application No. PCT/FR97/01015 mailed Sep. 16, 1997.
International Preliminary Examination for Application No. PCT/FR97/01015 mailed Aug. 20, 1998.

* cited by examiner

Primary Examiner—William Powell
(74) Attorney, Agent, or Firm—Conley, Rose & Tayon, P.C.

(57) ABSTRACT

A process for etching a gate conductor material in the fabrication of MOS transistors is presented. A hard mask layer composed of silicon oxynitride is formed upon a gate conductor layer. The hard mask layer is preferably patterned using a resin layer. The patterned hard mask layer is preferably used to form a patterned gate conductor. The gate conductor is preferably composed of polycrystalline silicon or a silicon-germanium alloy.

20 Claims, 1 Drawing Sheet

PROCESS FOR ETCHING THE GATE IN MOS TECHNOLOGY USING A SION-BASED HARD MASK

BACKGROUND OF THE INVENTION

1. Field of the Invention

Generally, the invention relates to the etching of the gate material in the fabrication of field-effect transistors.

2. Description of the Related Art

In the fabrication of MOS transistors, polysilicon or an alloy of silicon and germanium is generally used as the gate material. This material is deposited on a thin layer of thermal oxide, also called gate oxide, and then etched to the dimensions of the gate.

The etching, by any means whatsoever, may be carried out using a hard mask which defines the region intended subsequently to form the gate and which protects the said region during the operation. An inorganic material, such as silicon dioxide or silicon nitride, is therefore normally used for the hard mask. The absence of carbon in the material of which the mask is composed, responsible for destroying the gate oxide layer when etching the gate, makes it possible to significantly increase the selectivity of the etching of the gate material made of polycrystalline silicon or of a silicon-germanium alloy with respect to the gate oxide.

Nevertheless, the use of these conventional masks has drawbacks which impair the quality of the transistors fabricated.

It is known to isolate the future active regions of a semiconductor device in a conventional manner (LOCOS) or by shallow trenches (STI or Shallow Trench Isolation) using silicon dioxide. When the hard mask for etching the gate is made of silicon dioxide, its removal runs the risk of cutting away the trenches or of destroying the isolation region because it is of the same nature as the isolation oxide.

Moreover, using a hard mask based on silicon nitride runs the risk of destroying the gate material when removing the mask. This is because the process of etching silicon nitride is very similar to that for silicon, which results in poor etching selectivity between these 2 materials and in detection of the end of etching of the hard mask that occurs at the gate not being sufficient to prevent partial destruction of the gate lying beneath the hard mask.

It would therefore seem to be necessary to develop a process for etching the gate material which does not have the abovementioned drawbacks.

SUMMARY OF THE INVENTION

The inventors have demonstrated that the use of a thin and porous layer based on nitrided silicon oxide SiON, as a hard mask for etching the gate material, makes it possible to overcome the drawbacks observed with the masks of the prior art. The material SiON has all the properties required of a hard mask. Furthermore, its removal is simplified, without in any way destroying either the thermal oxide or the gate material.

In the microelectronics field, nitrided silicon oxide is generally used as material for antireflective layers. In particular, this material limits the reflectivity of tungsten- or aluminium-based subjacent layers during the photolithography of these layers, as well as the parasitic effects of reflection off the subjacent layers during exposure of the photosensitive organic layer.

The invention provides a process for etching the gate material in the fabrication of field-effect transistors, comprising at least the following steps:

a) a thin and porous layer of a SiON-based alloy is deposited on a semiconductor substrate coated with a thermal oxide first layer and with a second layer made of polycrystalline silicon or of a silicon-germanium alloy;

b) the said layer is etched using a resin mask produced on the SiON-based layer, in order to form a hard mask;

c) after the masking resin has been removed, the region predefined by the hard mask in the layer made of polycrystalline silicon or of a silicon-germanium alloy is etched in order to form the future gate; and d) the SiON-based hard mask is removed.

In step a), "thin layer" should be understood to mean a layer whose thickness is between 500 and 2000 Å, typically 1500 Å. The composition of the alloy of which this layer is composed is preferably $Si_xO_yN_z$, in which x is between 35 and 45% and z is between 40 and 60%, y making the total up to 100%. These percentages are atomic percentages.

The SiON-based alloy layer may be deposited on the gate material by plasma-enhanced chemical vapour deposition at low temperature, and more particularly at about 300° C.

The etching of the SiON-based hard mask in step b) is advantageously assisted by end-of-etching detection that takes place at the subjacent layer based on polycrystalline silicon or on a silicon-germanium alloy then acting as a stop layer for the operation.

In step c), the etching of the gate in the layer based on polycrystalline silicon or on a silicon-germanium alloy may also be advantageously assisted by end-of-etching detection that takes place at the thermal oxide layer acting as the stop layer for the operation.

In step d), the SiON-based hard mask may be removed chemically, such as especially by liquid etching, or by plasma etching. This operation may advantageously be assisted by end-of-etching detection that occurs as the future gate then acting as a stop layer for the operation.

Alternatively, in step d), the removal of the SiON-based hard mask is preceded by a step of forming lateral spacers based on silicon dioxide or on silicon nitride which are placed on each side of the future gate.

BRIEF DESCRIPTION OF THE DRAWINGS

Other advantages and characteristics will appear upon examination of the detailed description of entirely non-limiting ways of implementing and of carrying out the invention, and of the appended drawings, in which.

DETAILED DESCRIPTION OF THE INVENTION

Figure 1A:
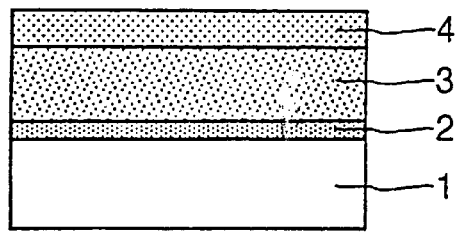
FIGS. 1a to 1e and 1e' illustrate the way of implementing the process of the invention.

As illustrated in FIG. 1a, a thin and porous layer 4 of an SiON-based alloy is deposited on a semiconductor substrate 1 coated in succession with a thermal oxide layer 2 and with a layer of a gate material. The thermal oxide layer 2 generally consists of silicon dioxide and typically has a thickness of between 30 and 250 Å. The gate material is based on polycrystalline silicon or on a silicon-germanium alloy and has a thickness of between 1000 and 4000 Å, typically 2000 Å.

The SiON-based layer is deposited by low-temperature plasma-enhanced chemical vapour deposition (PECVD). Temperatures of about 300° C. will typically be used. This type of deposition has the advantage over high-temperature furnace deposition of using only a low heat balance. During high-temperature oven deposition, dopant diffusion is observed when deposition takes place on materials already doped. With the low-temperature PECVD deposition according to the invention, dopant diffusion into the materials is reduced or even eliminated.

The other conditions for eliminating the PECVD deposition process are those usually employed in the microelectronics field. In the usual manner, it is preferred to operate with an inert gas, for example nitrogen, argon or helium. The active gas mixture contains precursors of the constituent elements of the SiON-based alloy. The composition of the alloy is $Si_xO_yN_z$, in which x is between 35 and 45%, z is between 40 and 60% and y makes the total up to 100%. These percentages are atomic percentages.

By varying the gas mixture during deposition, the composition of the SiON-based layer may be modified.

By adjusting the proportion of nitrogen in the alloy and the temperature conditions during deposition, it is possible to vary the selectivity, especially during removal of the mask, with respect to silicon dioxide, by using a high atomic percentage of nitrogen, or with respect to silicon nitride, by decreasing the proportion of nitrogen. It is thus possible, by adjusting the gas mixture, to optimize the selectivity of the etching of the mask with respect to the other materials present and exposed.

A thin and porous SiON-based layer, labelled 4 in FIG. 1a, is thus deposited with a thickness of between 500 and 2000 Å, typically 1500 Å, on the layer 3 of gate material.

Figure 1B:
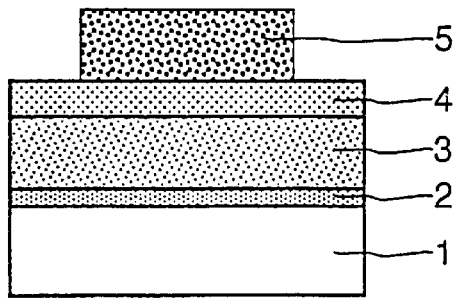

As illustrated in FIG. 1b, a photosensitive masking resin was deposited on the thin and porous SiON-based layer and etched, for example by photolithographic etching, using a mask that reproduces the region intended subsequently to form the gate. Using this resin mask 5, the thin and porous SiON-based layer 4 is etched by dry anisotropic etching in order to form the hard mask, also labelled 4.

This step of etching the hard mask is advantageously assisted by end-of-etching detection that takes place at the layer 3 made of polycrystalline silicon or of a silicon-germanium alloy then acting as the stop layer. The etching takes place and the end-of-etching detection occurs under conditions usual in the microelectronics field.

Figure 1C:
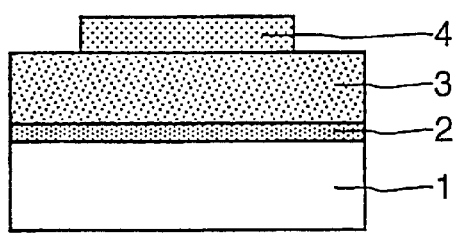

After the hard mask 4 has been etched, the masking resin is removed in the usual manner. The device illustrated in FIG. 1c is obtained, in which the semiconductor substrate 1 is covered with a thermal oxide first layer 2 and with a second layer 3 based on polycrystalline silicon or on a silicon-germanium alloy. The latter layer lies beneath a hard mask 4 based on an SiON alloy predefining the region intended to form the gate.

Figure 1D:
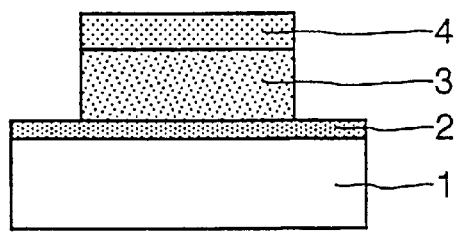

As illustrated in FIG. 1d, the layer 3 is etched in a conventional manner by dry anisotropic etching using the SiON-based hard mask 4 in order to form the future gate of the MOS transistor. The etching of the gate material may advantageously be assisted by end-of-etching detection that takes place at the thermal oxide layer 2 then acting as the stop layer for the etching operation.

The process has an additional advantage in this step of etching the gate in that the SiON material used as hard mask has antireflective properties which limit reflection off the subjacent layer when the latter is etched by photolithographic etching.

In a final step, the SiON-based hard mask 4 is removed in a simplified manner. This removal preferably takes place by chemical means, especially by liquid isotropic etching, or by plasma etching. It turns out in fact that removal by chemical means does not destroy the exposed thermal oxide layer 2 since the etching rate of the SiON-based material may be up to one hundred and fifty times greater than that of silicon dioxide and seven times that of silicon nitride in liquid etching and forty times that of silicon dioxide in plasmic etching. Furthermore, the selectivity of this removal operation is infinite with respect to the polycrystalline silicon or to the silicon-germanium alloy of which the gate material is composed. This infinite difference between the etching rates of the SiON-based material and the gate material advantageously assists the step of removing the hard mask 4 by end-of-etching detection that takes place at the layer 3 forming the gate and then acting as the stop layer for the etching. The etching conditions and the end-of-etching detection conditions are the usual ones in the microelectronics field.

The high selectivity during removal of the mask for etching the SiON-based material with respect to the materials surrounding it may also advantageously be used when removing the hard mask after lateral spacers based on silicon dioxide or on silicon nitride have been formed. Thus, according to one method the step of removing the SiON-based hard mask is preceded by a step of forming lateral spacers 6 based on silicon dioxide or on silicon nitride which are placed on each side of the future gate 3. It is thus possible, after removing the hard mask, to obtain spacers 6 whose height is greater than the gate height by approximately the value of the thickness of the SiON layer. This type of spacer is beneficial, especially in order to limit the short-circuit phenomena observed between the gate and the active region during selective siliciding of the silicon.

Figure 1E:
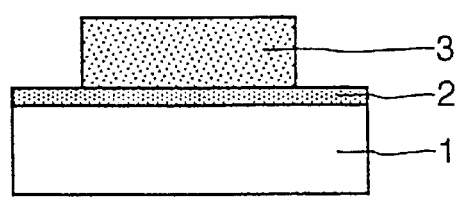
Figure 1E:
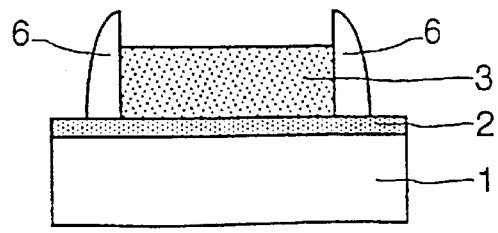

Thus, according to the method the devices illustrated in FIGS. 1e and 1e' are obtained.

In FIG. 1e, the semiconductor substrate 1 is coated over its entire surface with a thermal oxide 2 on which the layer 3 based on polycrystalline silicon or on a silicon-germanium alloy forms the future gate of a MOS transistor.

In FIG. 1e', the semiconductor substrate 1 is coated over its entire surface with a thermal oxide 2 on which spacers 6 made of silicon dioxide or of silicon nitride are placed on each side of the future gate 3 based on polycrystalline silicon or on a silicon-germanium alloy. The height of these spacers is greater than the height of the gate by approximately the thickness of the SiON-based hard mask.

The semiconductor device thus obtained may undergo the usual subsequent treatments necessary for the fabrication of an MOS transistor.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

We claim:

1. Process for etching a gate material in the fabrication of MOS transistors, comprising:

a) a thin and porous layer of a SiON-based alloy whose composition is $Si_xO_yN_z$, in which x is between about 0.35 and 0.45 and z is between about 0.40 and 0.60, y differing from zero and making the total of x+y+z up to 1, is deposited on a semiconductor substrate already coated with a thermal oxide first layer and with a second layer comprising polycrystalline silicon;

b) the said SiON-based layer is etched, using a resin mask produced on the SiON-based layer, in order to form a hard mask;

c) after the masking resin has been removed, the region predefined by the hard mask in the layer based on polycrystalline silicon or on a silicon-germanium alloy is etched in order to form the future gate; and d) the SiON-based layer is removed.

2. Process according to claim 1, wherein in step a), the thin and porous layer of a SiON-based alloy has a thickness of between about 500 and 2000 Å.

3. Process according to claim 1, wherein the thin and porous SiON-based layer is deposited by low-temperature plasma-enhanced chemical vapour deposition.

4. Process according to claim 1 wherein in step b), the etching of the hard mask is assisted by end-of-etching detection that takes place at the second layer.

5. Process according to claim 1 wherein in step c), the etching of the gate in the second layer is assisted by end-of-etching detection that takes place at the thermal oxide layer.

6. Process according to claim 1 wherein the SiON-based hard mask is removed by liquid isotropic etching in step d).

7. Process according to claim 1 wherein the SiON-based hard mask is removed by plasma etching in step d).

8. Process according to claim 6 wherein the etching is assisted by end-of-etching detection that takes place at the second layer.

9. Process according to claim 1 wherein in step d), the removal of the SiON-based hard mask is preceded by a step of forming lateral spacers based on silicon dioxide which are placed on each side of the future gate.

10. Process according to claim 7, wherein the etching is assisted by end-of-etching detection that takes place at the second layer.

11. Process according to claim 1 wherein in step d), the removal of the SiON-based hard mask is preceded by a step of forming lateral spacers based on silicon nitride which are placed on each side of the future gate.

12. A process for etching a gate material in the fabrication of MOS transistors, comprising:

forming an oxide layer upon a semiconductor substrate;

forming a gate conductor layer upon the oxide layer, the gate conductor layer comprising a silicon-germanium alloy;

forming a hard mask layer upon the gate conductor layer, the hard mask layer comprising an alloy whose composition is $Si_xO_yN_z$ where x is between about 0.35 and 0.45, z is between about 0.40 and 0.60, and y is greater than zero and wherein the total of x+y+z is about 1.0;

forming a patterned resin masking layer upon the hard mask layer;

etching the hard mask layer using the patterned resin mask such that the hard mask layer is patterned;

removing portions of the gate conductor layer exterior to the patterned hard mask layer to form a gate conductor.

13. The process of claim 12, wherein the hard mask layer is formed by a low-temperature plasma-enhanced chemical vapour deposition.

14. The process of claim 12, wherein etching the hard mask layer comprises ending the etching of the hard mask layer the gate conductor layer is detected.

15. The process of claim 12, wherein removing potions of the gate conductor layer comprises ending the removal of the gate conductor layer when the thermal oxide layer is detected.

16. The process of clam 12, wherein etching the hard mask layer comprises liquid isotropic etching.

17. The process of claim 12, wherein etching the hard mask layer comprises plasma etching.

18. The process of claim 12, further comprising removing the hard mask layer.

19. An integrated circuit prepared using the process of claim 12.

20. An integrated circuit comprising:

a gate oxide layer formed upon a semiconductor substrate;

a gate conductor formed upon the gate oxide layer, the gate conductor comprising a silicon-germanium alloy or polycrystalline silicon; and a hard mask layer formed upon the gate conductor, the hard mask layer comprising an alloy whose composition is $Si_xO_yN_z$ where x is between about 0.35 and 0.45, z is between about 0.40 and 0.60, and y is greater than zero and wherein the total of x+y+z is about 1.0.

* * * * *